(12) United States Patent
Bjork

(10) Patent No.: US 7,458,466 B2
(45) Date of Patent: *Dec. 2, 2008

(54) STACK PROCESSING TRAY FOR INTEGRATED CIRCUIT DEVICES

(75) Inventor: Russell S. Bjork, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/280,161

(22) Filed: Nov. 16, 2005

(65) Prior Publication Data

US 2006/0078415 A1    Apr. 13, 2006

Related U.S. Application Data

(60) Continuation of application No. 10/172,134, filed on Jun. 14, 2002, now Pat. No. 7,104,748, which is a division of application No. 09/511,660, filed on Feb. 22, 2000, now Pat. No. 6,474,475.

(51) Int. Cl.
    *B65D 73/02*    (2006.01)

(52) U.S. Cl. ..................... 206/725; 206/499; 206/564

(58) Field of Classification Search ............. 206/701, 206/706–712, 499, 722–728, 564, 821
    See application file for complete search history.

(56) References Cited

U.S. PATENT DOCUMENTS

| | | | |
|---|---|---|---|
| 1,835,350 A | 12/1931 | Soffel | |
| 3,191,791 A * | 6/1965 | Jackson | 206/725 |
| 3,306,439 A | 2/1967 | Storey | |
| 3,351,264 A | 11/1967 | Bostrom | |
| 4,090,606 A * | 5/1978 | Dawson | 206/223 |
| 4,573,574 A | 3/1986 | Connery | |
| 4,600,936 A | 7/1986 | Khoury et al. | |
| 4,826,012 A | 5/1989 | Kosanovich | |
| 5,103,976 A | 4/1992 | Murphy | |
| 5,203,452 A | 4/1993 | Small et al. | |
| 5,228,569 A | 7/1993 | House | |
| 5,246,129 A | 9/1993 | Small et al. | |
| 5,307,011 A | 4/1994 | Tani | |
| 5,310,076 A | 5/1994 | Burton et al. | |
| 5,335,771 A | 8/1994 | Murphy | |
| 5,400,904 A | 3/1995 | Maston, III et al. | |

(Continued)

FOREIGN PATENT DOCUMENTS

JP    3218048    9/1991

OTHER PUBLICATIONS

Translation of JP 3218048, Publication date Sep. 25, 1991 to Matsushita Electronics Corporation (6 pages).

*Primary Examiner*—Luan K Bui
(74) *Attorney, Agent, or Firm*—TraskBritt

(57) ABSTRACT

A stack processing tray for use with tray-based integrated circuit device handling systems is disclosed. The stack processing tray has a plurality of cells, each cell being configured to receive at least two integrated circuit devices in a vertically superimposed, stacked relationship. Increased efficiency in the handling and processing of integrated circuit devices is realized as the tray-based integrated circuit device handling system performs fewer tray movements, and therefore less work, to handle a given number of integrated circuit devices.

12 Claims, 5 Drawing Sheets

U.S. PATENT DOCUMENTS

| | | |
|---|---|---|
| 5,421,455 A | 6/1995 | Clatanoff et al. |
| 5,492,223 A | 2/1996 | Boardman et al. |
| 5,547,082 A | 8/1996 | Royer et al. |
| 5,551,572 A | 9/1996 | Nemoto |
| 5,553,711 A * | 9/1996 | Lin et al. ............ 206/710 |
| 5,636,745 A | 6/1997 | Crisp et al. |
| 5,731,230 A | 3/1998 | Nevill et al. |
| 5,848,702 A | 12/1998 | Pakeriasamy |
| 5,890,599 A | 4/1999 | Murphy |
| 5,927,503 A | 7/1999 | Nevill et al. |
| 5,957,293 A | 9/1999 | Pakeriasamy |
| 6,008,991 A | 12/1999 | Hawthorne et al. |
| 6,015,064 A | 1/2000 | Liu |
| 6,109,445 A | 8/2000 | Beyer |
| 6,112,940 A | 9/2000 | Canella |
| 6,202,883 B1 | 3/2001 | Narazaki et al. |
| 6,357,595 B2 | 3/2002 | Sembonmatsu et al. |
| 6,476,629 B1 | 11/2002 | Bjork |
| 6,506,073 B2 | 1/2003 | McCutchan et al. |
| 6,612,442 B2 | 9/2003 | Soh et al. |

\* cited by examiner

STACK PROCESSING TRAY FOR INTEGRATED CIRCUIT DEVICES

CROSS-REFERENCE TO RELATED APPLICATIONS

This application is a continuation of application Ser. No. 10/172,134, filed Jun. 14, 2002, now U.S. Pat. No. 7,104,748, issued Sep. 12, 2006, which is a divisional of application Ser. No. 09/511,660, filed Feb. 22, 2000, now U.S. Pat. No. 6,474,475, issued Nov. 5, 2002.

BACKGROUND OF THE INVENTION

1. Field of the Invention

The present invention relates generally to the manufacture of semiconductor devices and, more particularly, to the handling of integrated circuit devices throughout the manufacturing process. Specifically, the present invention is directed to a tray-based method and apparatus for handling integrated circuit devices orientated in an array of integrated circuit device stacks, each stack consisting of multiple integrated circuit devices.

2. State of the Art

During the manufacture and testing of integrated circuit (IC) devices, processing trays—also referred to as carrier trays, component trays, IC device trays, or in-process trays—are routinely used for handling large numbers of IC devices. Tray-based IC device handling systems are commonly adapted to supply IC devices to primary processing systems such as, for example, sorting and binning equipment, burn-in and electrical test systems, or any other IC device processing system as known in the art. Tray-based IC device handling systems may be configured for use with a number of different types of IC devices, including dual in-line packages (DIPs), zigzag in-line packages (ZIPs), thin small outline packages (TSOPs), small outline J-lead packages (SOJs), ball-grid arrays (BGAs), pin-grid arrays (PGAs), quad flat packages (QFPs), pad array carriers (PACs), and plastic leaded chip carriers (PLCCs).

Presently, numerous conventional processing tray designs are used with tray-based IC device handling systems. Conventional processing trays generally comprise a frame enclosing a planar, open lattice structure. The latticework forms a two-dimensional array of cells, typically comprising a plurality of rows and a plurality of columns of cells, wherein each cell is configured to receive an individual IC device. Thus, a conventional processing tray for handling IC devices provides a planar, two-dimensional array of cells wherein each cell is capable of accepting an individual IC device.

The structure and function of the tray frame and cells vary among the conventional designs. For example, in U.S. Pat. No. 5,203,452 to Small et al., individual cells can be severed from the frame to facilitate handling of an individual IC device. Similarly, in U.S. Pat. No. 5,246,129 to Small et al., rows of cells containing IC devices may be severed from the frame. Crisp et al., U.S. Pat. No. 5,636,745, disclose a system of interlocking, stackable IC device processing trays. Boardman et al., U.S. Pat. No. 5,492,223, also disclose interlocking and stackable IC device trays, but each tray is configured to hold only a single IC device. In U.S. Pat. No. 4,600,936, Khoury et al. teach the use of a reference surface within each cell of a two-dimensional array of cells to assist in the placement and alignment of an individual IC device within each cell. Murphy, U.S. Pat. No. 5,103,976, discloses a system of stackable IC device trays and spacer trays wherein oversized IC devices can be accommodated using a spacer tray disposed between two stacked IC device trays, each IC device tray consisting of a two-dimensional array of cells. In U.S. Pat. No. 5,927,503, Nevill et al. disclose a processing tray for handling IC devices comprised of two-dimensional array of cells; however, each cell is configured to accept an insert and it is the insert that is adapted to receive at least one IC device. None of these conventional IC device processing trays have a cell capable of accepting multiple IC devices in a stacked relationship.

Another conventional processing tray design widely used within the semiconductor industry is the JEDEC tray. These trays are designed and built in compliance with standards propagated by the Joint Electronic Device Engineering Council (JEDEC). Generally, a JEDEC tray consists of a grid-like, open lattice structure that forms a planar, two-dimensional array of IC device cells. JEDEC trays are usually injection molded from plastic and vary in overall dimensions and grid-size, depending on the type of IC device the tray is designed to hold. JEDEC trays are stackable and also have surface features, such as locating and hold-down tabs, that allow the trays to be manipulated by automatic processing and testing equipment. Although a JEDEC tray itself can be disposed on top of another JEDEC tray to form a stack of multiple trays, an individual cell within the array of cells on each tray is capable of holding only a single IC device. Although a JEDEC tray itself can be disposed on top of another JEDEC tray to form a stack of multiple trays, an individual cell within the array of cells on each tray is capable of holding only a single IC device.

Within an IC device manufacturing facility, tray-based IC device handling systems are used to move processing trays, and a plurality of IC devices disposed therein, from one processing station to a subsequent processing station and, otherwise, throughout the manufacturing facility. For example, a tray-based IC device handling system may be used to move a plurality of IC devices disposed in one or more processing trays to a first processing station. The first processing station may comprise fabrication equipment, burn-in and electrical testing equipment, sorting and binning equipment, or any other appropriate IC device processing systems as are known in the art. The plurality of IC devices is transferred to the first processing station for testing, fabrication, or other manufacturing processes. After processing at the first processing station is complete, the tray-based IC device handling system transfers the plurality of IC devices to one or more processing trays and those processing trays are moved to a second processing station. The tray-based IC device handling system then transfers the plurality of IC devices to the second processing station for testing, fabrication, or other manufacturing processes.

Generally, a conventional tray-based IC device handling system includes a tray source, a pick-and-place mechanism, and an alignment mechanism. The tray source is configured to move processing trays between processing stations. The pick-and-place mechanism is configured for removing individual IC devices from a processing tray and, further, for transferring the IC devices to a processing station. The pick-and-place mechanism has an extraction head adapted to lift, or "pick," an IC device from its cell on a processing tray.

In order for an IC device to be extracted, or "picked," from a processing tray, the extraction head of the pick-and-place mechanism must be aligned with the cell in which that IC device rests. Alignment between the extraction head and the cell is achieved by the alignment mechanism. The alignment mechanism includes a multi-dimensional motion system capable of accurately positioning a processing tray relative to the pick-and-place mechanism. The tray source, pick-andplace mechanism, and alignment mechanism, or any combination thereof, may form part of a single, integrated system.

Tray-based IC device handling systems tend to be slow and inefficient. Positioning systems, such as the tray source and the alignment mechanism, generally move at slow speeds relative to the pace at which other processing equipment can operate. Because conventional processing trays are configured to receive only a two-dimensional array of IC devices— each cell of the processing tray accepting only a single IC device—the tray-based IC device handling system must align a cell of the processing tray with the extraction head of the pick-and-place mechanism after the removal of every individual IC device from the processing tray. The necessity of aligning a different cell with the extraction head after the removal of each IC device results in inefficient handling and processing of IC devices. Also, because only a two-dimensional array of IC devices can be disposed on any conventional processing tray, a large number of processing trays are required.

Thus, a need exists in the semiconductor industry for a method and apparatus for processing large numbers of IC devices using a tray-based IC device handling system that is efficient, both in terms of processing time and in terms of reducing the number of required processing trays.

BRIEF SUMMARY OF THE INVENTION

The present invention provides a more efficient processing tray, and a method of using the same, suitable for use with tray-based integrated circuit device handling systems. The processing tray of this invention may include a generally planar latticework bounded by a frame, or support, structure. The latticework may form an array of cells in rows and columns, each cell of the lattice structure being of a depth sufficient to accept a stack of a selected number of IC devices. The stack of IC devices will comprise at least two individual IC devices; thus, the processing tray, or stack processing tray, according to this invention is configured for holding a three-dimensional array of IC devices. Also, entanglement of leads extending from each IC device in a stack of IC devices, and damage thereto, may be eliminated using lead protection elements disposed between adjacent IC devices within the stack.

The stack processing tray according to the present invention may be used with conventional tray-based IC device handling systems to process a plurality of IC devices. A method of processing a plurality of IC devices using stack processing trays may include unloading of the IC devices from a first processing station and the subsequent loading of the IC devices onto a plurality of stack processing trays. The IC devices are disposed on each stack processing tray in one or more stacks, each stack comprising a selected number of IC devices arranged in a vertically superimposed relationship.

One or more stack processing trays carrying IC devices may then be transported into a target zone proximate an alignment mechanism. The target zone is adjacent a pick-and-place mechanism and is also in proximity to a second processing station. The alignment mechanism sequentially aligns each cell of all stack processing trays located in the target zone with an extraction head associated with the pick-and-place mechanism. As each cell is aligned with the extraction head, the pick-and-place mechanism removes each IC device and transfers that IC device to the second processing station. Between extractions of successive IC devices from any individual cell, no movement of the stack processing tray is required. After removal of all IC devices from the stack processing trays located in the target zone, one or more other stack processing trays carrying IC devices may be moved into the target zone and the above-described method may be repeated to transfer the IC devices to the second processing station.

A stack processing tray according to this invention may be used with a tray-based IC device handling system to supply IC devices to a processing station within the IC device manufacturing facility. Stack processing trays may also be used with a tray-based IC device handling system for moving IC devices within an individual processing station. Additionally, stack processing trays may be used for IC device storage and for shipping IC devices to customers.

BRIEF DESCRIPTION OF THE SEVERAL VIEWS OF THE DRAWINGS

While the specification concludes with claims particularly pointing out and distinctly claiming that which is regarded as the present invention, the features and advantages of this invention can be more readily ascertained from the following detailed description of the invention when read in conjunction with the accompanying drawings, in which:

DETAILED DESCRIPTION OF THE INVENTION

FIGS. 1 through 4 make reference to many identical elements, and these identical elements retain the same numerical designation in all figures.

Figure 1:
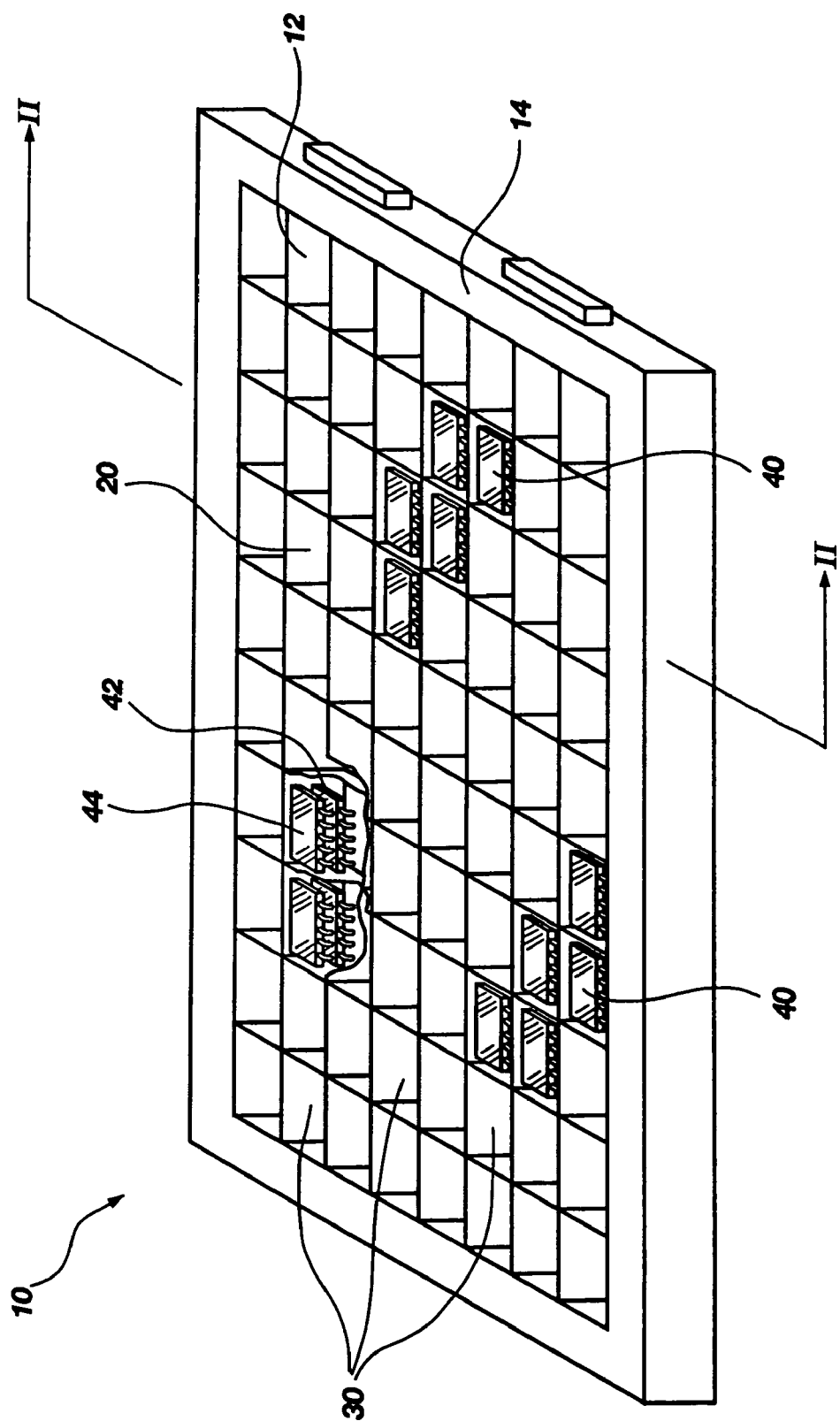
FIG. 1 is a perspective view of a stack processing tray of the present invention.

FIG. 1 shows a stack processing tray 10 for use with a tray-based IC device handling system. The stack processing tray 10 includes a generally planar lattice structure 12 bounded within a perimeter formed by a frame structure (latticework) 14. The lattice structure 12 forms a two-dimensional cell array 20. The cell array 20 has a plurality of individual cells 30 in rows and columns that are each configured to hold a plurality of IC devices in a vertically superimposed, stacked relationship. While shown as a uniform, two-dimensional array, the cell array 20 may, of course, be arranged in any suitable pattern for which IC device handling systems are programmed, although the row and column type array shown in FIG. 1 is most typical. The stack processing tray 10 may be injection molded of an anti-static plastic material; however, any suitable material and fabrication method as known in the art may be used.

In FIG. 1, a plurality of individual cells 30 is shown, each holding a stack of IC devices 40. For example, as can be seen where a portion of the lattice structure 12 has been cut away, a stack of IC devices 40 may include a first IC device 42 and a second IC device 44. Although not every cell 30 is shown with IC devices 40 disposed therein, it is to be understood that every cell 30 may contain IC devices 40. Referring to the right-hand side of FIG. 2, the first and second IC devices 42, 44 are shown in cross-section disposed within a cell 30. The second IC device 44 is stacked upon the first IC device 42 in an abutting relationship, and the first IC device 42 rests on the base 32 of the cell 30. It will be appreciated by those of ordinary skill in the art that more than two IC devices 40 may be disposed in a single cell 30. By way of example only, as shown on the left-hand side of FIG. 2, a cell 30 may contain three IC devices 40 in a stacked relationship. The size and shape of each cell 30 and cell base 32 of the cell array 20 will vary depending on the type of IC device that the stack processing tray 10 is intended to carry. For example, the base 32 of a cell 30 may have surface features that are adapted to form a mating relationship with IC devices having a specific type of lead configuration. Any suitable cell configuration as known in the art may be used.

Figure 2:
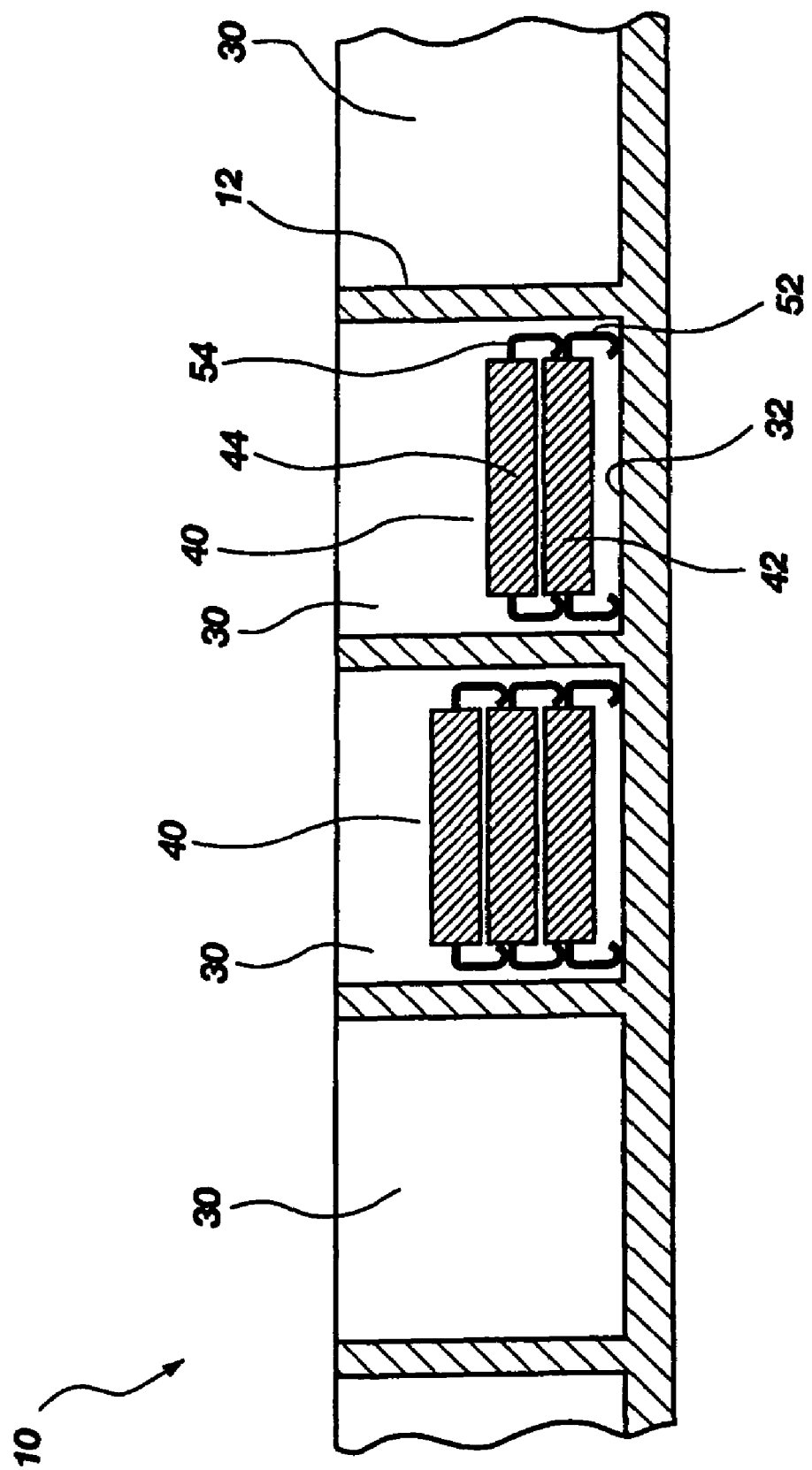
FIG. 2 is a partial cross-sectional view of the stack processing tray taken along line II-II of FIG. 1.

Referring again to FIG. 2, the first and second IC devices 42, 44 have leads 52, 54, respectively, extending downwardly from body portions thereof. Although J-lead type packages are shown in FIG. 2, the stack processing tray 10 can be used with IC devices having any type of lead configuration as is known in the art. For some types of IC devices, a potential exists that the leads of one IC device, for example, the leads 54 of the second IC device 44, may become entangled with another IC device and its attached leads, for example, the first IC device 42 and accompanying leads 52, as shown in FIG. 2. To prevent the entanglement of IC device leads within a stack of IC devices 40, a lead protection element may be disposed between adjacent IC devices.

Figure 3A:
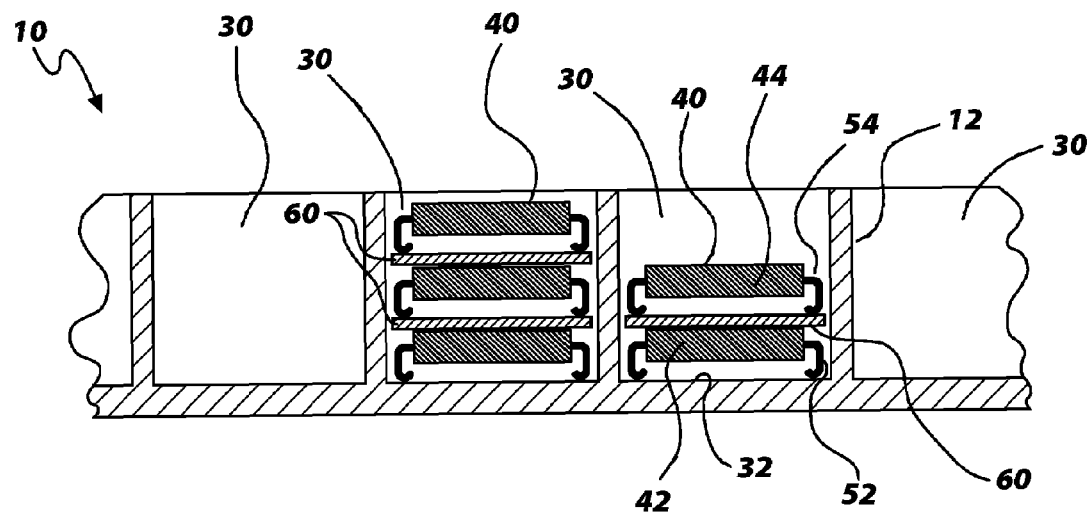
FIG. 3A is a partial cross-sectional view of the stack processing tray taken along line II-II of FIG. 1 and showing lead protection elements having a plate-like structure disposed between adjacent IC devices.
Figure 3B:
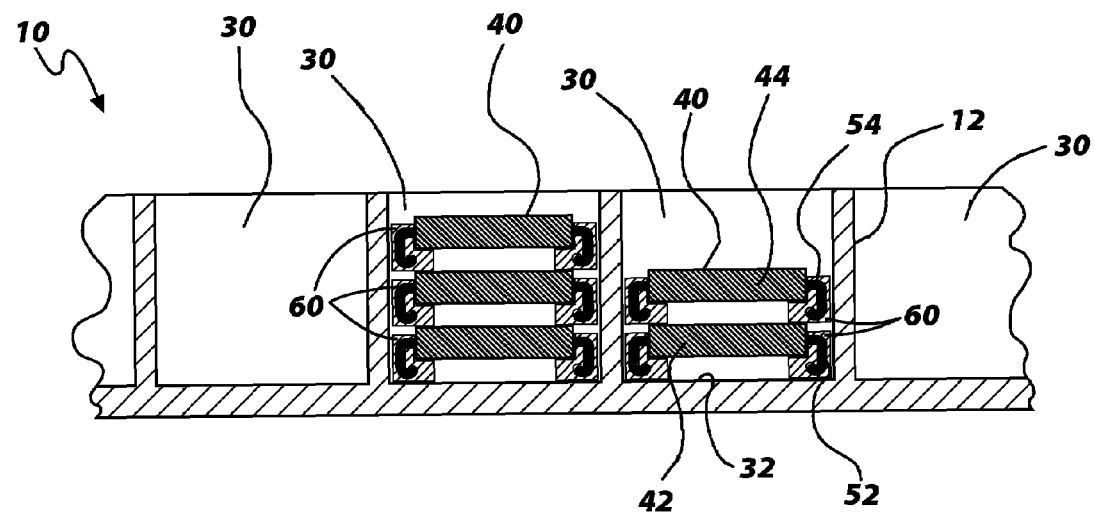
FIG. 3B is a partial cross-sectional view of the stack processing tray taken along line II-II of FIG. 1 and showing lead protection elements, which are sleeves that slidably mate with the leads of the IC devices.

As shown on the right-hand side of FIGS. 3A and 3B, a lead protection element 60 is disposed between, and forming an abutting relationship with, the first IC device 42 and the second IC device 44. The lead protection element 60 may be removably attached to the first IC device 42 or removably attached to the second IC device 44. Alternatively, although less preferred, the lead protection element 60 may be stand-alone, in which case it is affixed to neither of the first or second IC devices 42, 44. The lead protection element 60 may be fabricated from any suitable material as known in the art, such as an anti-static plastic material. The lead protection element 60 may also be of any suitable configuration. For example, the lead protection element 60 may be a plate-like structure, as is depicted in FIG. 3A, an element 60 that slidably mates with the leads of an IC device 40 as depicted in FIG. 3B, or any other suitable configuration. Again, those of ordinary skill in the art will appreciate that each cell 30 may contain more than two IC devices 40. For example, as shown on the left-hand side of FIG. 3A, a cell 30 may contain three IC devices 40, wherein a lead protection element 60 is disposed between adjacent IC devices 40.

Figure 4:
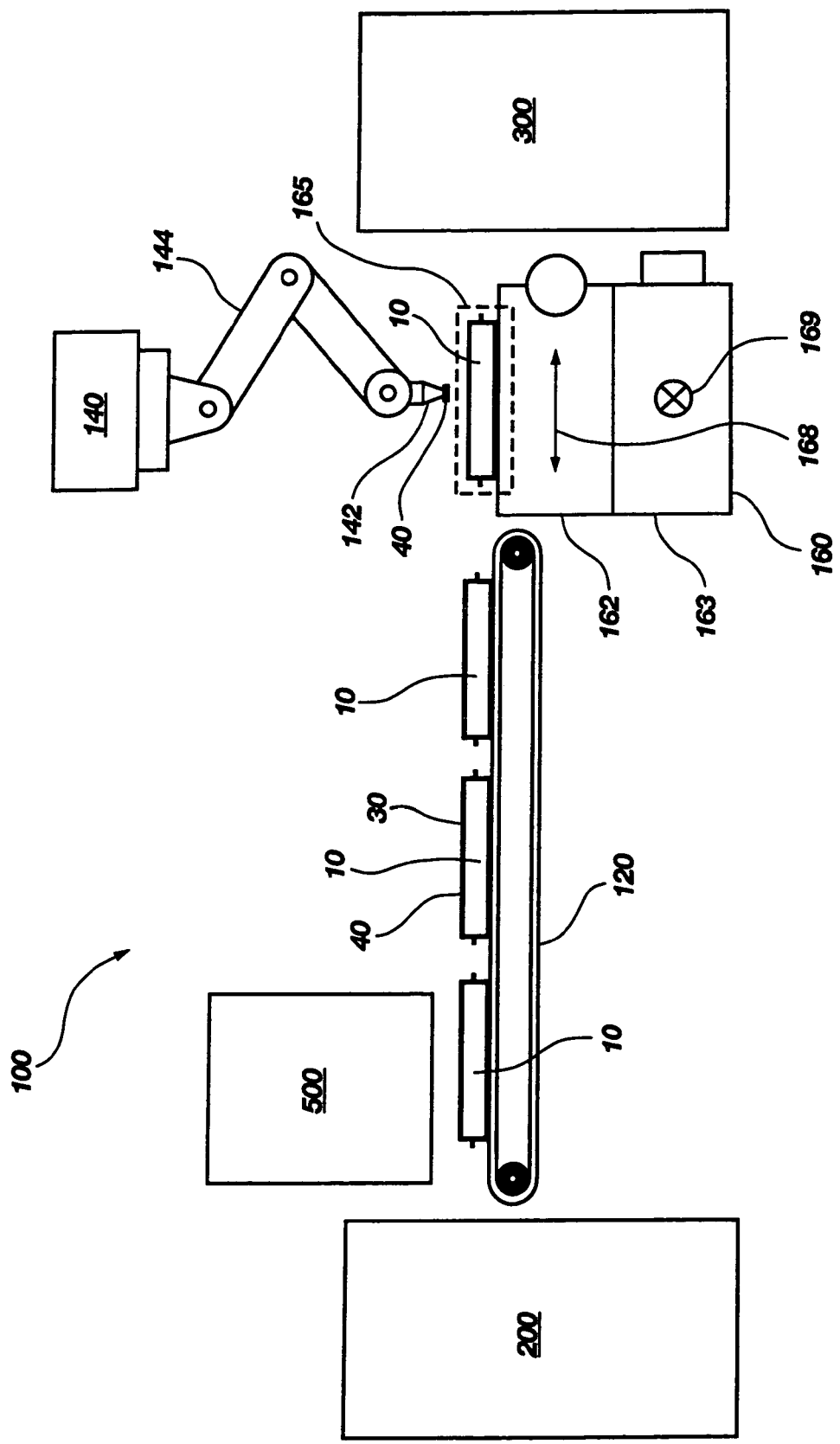
FIG. 4 is a schematic view of a tray-based IC device handling system using stack processing trays according to the present invention.

Shown in FIG. 4 is an exemplary tray-based IC device handling system 100 configured to move processing trays, and the IC devices disposed thereon, within the IC device manufacturing facility. For example, as shown in FIG. 4, the tray-based IC device handling system 100 may move stack processing trays 10 carrying IC devices 40 from a first processing station 200 to a second processing station 300. The processing stations 200, 300 may be burn-in and electrical testing systems, sorting and binning systems, or any other manufacturing or test apparatus as are known in the art. It will be understood by those of ordinary skill in the art that the tray-based IC device handling system 100 may also be used to move stack processing trays 10 within an individual processing station, between processing stations, and throughout the manufacturing facility wherever the need exists. For example, the tray-based IC device handling system 100 may be an integral part of a burn-in and electrical test system, or the tray-based IC device handling system 100 may be adapted to move stack processing trays 10 from a burn-in and electrical testing system to a sorting and binning system.

As shown in FIG. 4, the exemplary tray-based IC device handling system 100 may include a tray source 120, a pick-and-place mechanism 140, and an alignment mechanism 160. The tray source 120 is configured to sequentially move one or more stack processing trays 10 from the first processing station 200 into a target zone 165 near the second processing station 300. The tray source 120 is shown schematically in FIG. 4 as a conveyor; however, any other suitable apparatus capable of moving a stack processing tray 10 into the target zone 165 as is known in the art may be used. By way of example only, the tray source 120 may be a rotary table, a track, a robotic arm, a tray magazine, or any suitable combination thereof.

The pick-and-place mechanism 140 is configured to remove individual IC devices 40 from the cells 30 of a stack processing tray 10 and to transfer the IC devices 40 to the second processing station 300. The pick-and-place mechanism 140 includes an extraction head 142 capable of grasping an individual IC device 40 in order to pick the IC device 40 out of its cell 30. The extraction head 142 may be any suitable IC device extraction apparatus as is known in the art, such as a vacuum quill. A vacuum quill system may include a pressure sensor that senses the presence of an IC device by sensing a pressure drop as the quill approaches the surface of the IC device. Incremental movement of the quill toward the IC device during sensing may be controlled by a linear stepper motor for high precision.

The pick-and-place mechanism 140 may also include transfer mechanism 144. Transfer mechanism 144 is configured to transfer IC devices 40 to the second processing station 300 as the IC devices 40 are picked from a stack processing tray 10. The transfer mechanism 144 may be a robotic arm, as is shown schematically in FIG. 4, or any other suitable device as is known in the art. Those of ordinary skill in the art will understand that a tray-based handling system 100 may include multiple pick-and-place mechanisms 140, enabling the tray-based handling system 100 to simultaneously remove IC devices 40 from multiple cells 30 of a stack processing tray 10 and to simultaneously transfer multiple IC devices 40 to the second processing station 300.

The alignment mechanism 160 is configured to accurately align an individual cell 30 of a stack processing tray 10 resting within the target zone 165 with the extraction head 142, such that the IC devices 40 within that cell 30 may be picked from the cell 30 and transferred to the second processing station 300. Generally, the alignment mechanism 160 is any multi-dimensional motion system capable of movement in at least two mutually perpendicular, horizontal directions relative to the pick-and-place mechanism 140. For example, as shown in FIG. 4, the alignment mechanism 160 may be a two-dimensional motion stage having a first stage 162 capable of movement in a first direction 168 and a second stage 163 capable of movement in a second, perpendicular direction 169. Any device known in the art that is capable of accurately aligning a cell 30 with the extraction head 142 may function as the alignment mechanism 160. Those of ordinary skill in the art will appreciate that the pick-and-place mechanism 140 may also include a multi-dimensional motion system to aid in cell alignment and, further, that the alignment mechanism 160 and pick-and-place mechanism 140 may form part of a single, integrated system. Similarly, the tray source 120 and alignment mechanism 160 may form part of a single, integrated system and, in another embodiment, the tray source 120, pick-and-place mechanism 140, and alignment mechanism 160 may all form part of an integrated system.

Figure 5:
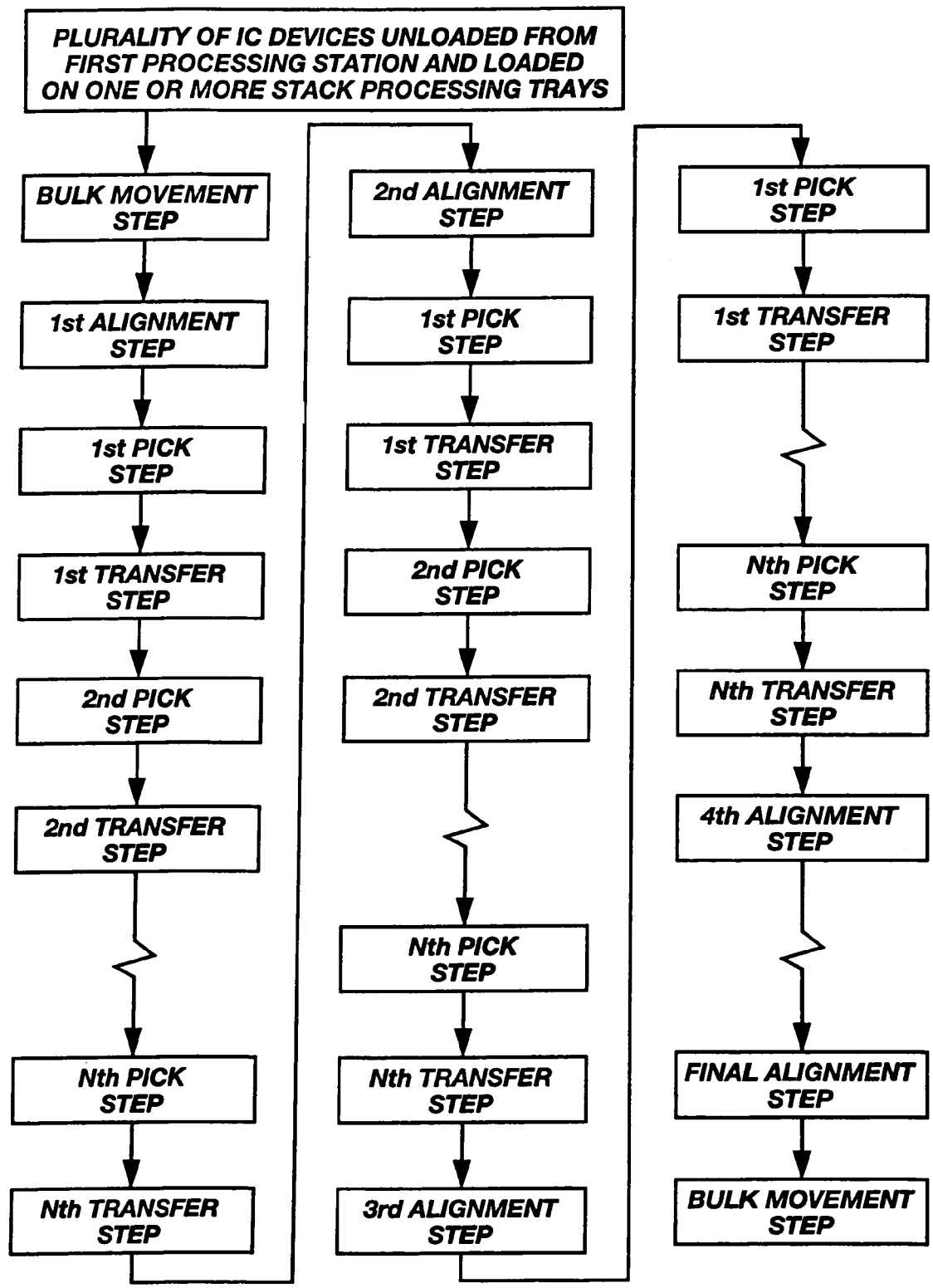
FIG. 5 is a flow chart showing a series of processing steps used to process a plurality of IC devices using stack processing trays according to the present invention.

With reference to FIG. 5, and the exemplary tray-based IC device handling system 100 shown in FIG. 4, the processing of a plurality of IC devices 40 disposed in one or more stack processing trays 10 may be performed as herein described. The plurality of IC devices 40 is unloaded from the first processing station 200 and is subsequently loaded onto one or more stack processing trays 10. Another pick-and-place mechanism 500, or other suitable unloading device, may be used for transferring the plurality of IC devices 40 to the stack processing trays 10. As the IC devices 40 are transferred to the stack processing trays 10, each individual cell 30 of a stack processing tray 10 will receive at least two IC devices 40 in a stacked relationship.

The tray source 120 then performs a bulk movement step in which the tray source 120 moves one or more stack processing trays 10 into the target zone 165 proximate the alignment mechanism 160. With one or more stack processing trays 10 disposed in the target zone 165, the alignment mechanism 160 performs a first alignment step to align the extraction head 142 with a first individual cell 30, and the IC devices 40 disposed therein, of the stack processing tray 10. The extraction head 142 then performs a first pick step, wherein the extraction head 142 picks a first IC device out of the first aligned cell, and the transfer mechanism 144 then performs a first transfer step to transfer the first IC device to the second processing station 300. The extraction head 142 then returns to the first aligned cell and performs a second pick step in which the extraction head 142 picks a second IC device out of the first aligned cell. A second transfer step is performed to transfer the second IC device to the second processing station 300. If additional IC devices 40 are contained within the first aligned cell, a pick step and transfer step are performed for each additional IC device 40 in the first aligned cell. For example, if N number of IC devices 40 are disposed in the first aligned cell, the tray-based IC device handling system 100 will perform N number of pick and transfer steps. However, all of the IC devices 40 contained within the first aligned cell are transferred to the second processing station 300 without the need to perform an intervening alignment step between the removal of successive IC devices.

Once all of the IC devices residing within the first aligned cell have been transferred to the second processing station 300, the alignment mechanism 160 performs a second alignment step to align a second individual cell 30 with the extraction head 142. A pick step and transfer step are then performed for each IC device 40 resting within the second aligned cell, without the necessity of performing an intervening alignment step between the removal of successive IC devices 40 from the second aligned cell. Again, for N number of IC devices disposed in the second aligned cell, N number of pick and transfer steps will be performed.

After removal of all IC devices 40 from the second aligned cell, a third alignment step is performed by the alignment mechanism 160 and the process is repeated to remove all of the IC devices 40 from the third aligned cell. The above-described sequence is repeated until the IC devices 40 within all of the individual cells 30 of each stack processing tray 10 within the target zone 165 have been removed. All of the cells 30 of each stack processing tray 10 within the target zone 165 having been stripped of their IC devices 40, the tray source 120 performs another bulk movement step to move one or more other stack processing trays 10, and the IC devices 40 disposed therein, into the target zone 165 proximate the alignment mechanism 160. The IC devices 40 contained within the one or more other stack processing trays 10 are then transferred to the second processing station 300 in the same manner as described with respect to the stack processing trays 10 moved into the target zone 165 during the initial bulk movement step.

If lead protection elements 60 (see FIG. 3) are disposed between adjacent, stacked IC devices 40, the lead protection elements 60 must also be removed. If a lead protection element 60 is removably associated with an IC device 40, the lead protection element 60 may be removed with the attached, respective IC device 40 and transferred to the second processing station 300. The lead protection element 60 may then be detached, if required, from the IC device 40 by a subsequent operation performed at the second processing station 300. If a lead protection element 60 is stand-alone, the extraction head 142 must perform a separate pick step to remove and discard the lead protection element 60. A receptacle (not shown) near the target zone 165 may be provided for disposal of the stand-alone lead protection elements 60.

The above-described process is continued until all of the plurality of IC devices 40 have been transferred to the second processing station 300. Those of ordinary skill in the art will appreciate the reduction in processing and handling time that can be achieved using stack processing trays 10 according to the present invention. Because multiple IC devices 40 are stacked within each cell 30 on a stack processing tray 10, the number of required alignment steps is significantly reduced for a given number of IC devices 40 being processed. If there are N number of IC devices 40 in each cell 30 of a stack processing tray 10, the time associated with aligning the cells 30 with the extraction head 142 is reduced by a factor of N. Similarly, for N number of IC devices 40 in each cell 30, the time associated with moving stack processing trays 10 into the target zone 165 is reduced by a factor of N as more IC devices 40 are moved into the target zone 165 after any given bulk movement step. As motion systems such as the tray source 120 and alignment mechanism 160 are generally slow and inefficient relative to other processing equipment, a significant reduction in processing time for a given number of IC devices can be achieved using stack processing trays according to the present invention.

Those of ordinary skill in the art will also appreciate that the total number of processing trays required to process a given number of IC devices 40 can be reduced using stack processing trays 10 according to the present invention. If each cell 30 of a stack processing tray 10 contains N number of IC devices 40, the number of stack processing trays 10 necessary to handle the IC devices 40 will be reduced by a factor of N as compared to a conventional processing tray containing only a two-dimensional array of IC devices 40. A further advantageous feature of the stack processing tray 10 according to the present invention is the tray's adaptability to conventional tray-based IC device handling systems. However, it will be understood by those of ordinary skill in the art that a conventional tray-based IC device handling system, such as the exemplary tray-based IC device handling system 100 shown in FIG. 4, may require some reprogramming to accommodate two or more IC devices stacked in each cell of a stack processing tray 10.

The foregoing detailed description and accompanying drawings are only illustrative and not restrictive. They have been provided primarily for a clear and comprehensive understanding of the present invention and no unnecessary limitations are to be understood therefrom. Numerous additions, deletions, and modifications to the preferred embodiment, as well as alternative arrangements, may be devised by those skilled in the art without departing from the spirit of the present invention and the scope of the appended claims.

What is claimed is:

1. A stack processing tray carrying a plurality of at least substantially identical integrated circuit devices, comprising:
   a generally planar latticework forming a plurality of rectangular cells, each of the rectangular cells being dimensioned in length to at least substantially conform to a length of an integrated circuit device of the plurality of at least substantially identical integrated circuit devices and dimensioned in width to at least substantially conform to a width of the integrated circuit device of the plurality of at least substantially identical integrated circuit devices;
   a cell base;
   at least one stack of at least two vertically superimposed integrated circuit devices of the plurality of at least substantially identical integrated circuit devices positioned on the cell base in a rectangular cell of the plurality of rectangular cells; and
   a lead protection element interposed between the at least two vertically superimposed integrated circuit devices.

2. The stack processing tray of claim 1, wherein the lead protection element comprises a plate-like structure sized and configured to prevent contact between vertically adjacent integrated circuit devices received within the rectangular cell when the lead protection element is interposed therebetween.

3. The stack processing tray of claim 1, wherein the lead protection element comprises a sleeve configured to slidably mate with a plurality of leads of one integrated circuit device of the at least two superimposed integrated circuit devices.

4. The stack processing tray of claim 1, wherein the rectangular cell of the plurality is configured to receive at least three superimposed semiconductor devices.

5. The stack processing tray of claim 1, wherein the plurality of rectangular cells is arranged in a two-dimensional array.

6. The stack processing tray of claim 5, wherein the plurality of rectangular cells is arranged in a plurality of rows and a plurality of columns of rectangular cells.

7. A stack processing tray carrying a plurality of at least substantially identical integrated circuit devices, comprising:
   a generally planar latticework forming a plurality of cells, each of the cells being dimensioned to at least substantially conform to a periphery of an integrated circuit device of the plurality of at least substantially identical integrated circuit devices;
   a cell base;
   at least two vertically stacked integrated circuit devices of the plurality of at least substantially identical integrated circuit devices positioned on the cell base in a cell of the plurality of cells; and
   a lead protection element interposed between the at least two vertically stacked integrated circuit devices.

8. The stack processing tray of claim 7, wherein the lead protection element comprises a plate-like structure sized and configured to prevent contact between the at least two stacked integrated circuit devices.

9. The stack processing tray of claim 7, wherein the lead protection element comprises a sleeve configured to slidably mate with a plurality of leads of one integrated circuit device of the at least two stacked integrated circuit devices.

10. The stack processing tray of claim 7, wherein the cell of the plurality is configured to receive at least three stacked semiconductor devices.

11. The stack processing tray of claim 7, wherein the plurality of cells is arranged in a two-dimensional array.

12. The stack processing tray of claim 11, wherein the plurality of cells is arranged in a plurality of rows and a plurality of columns of cells.

* * * * *